(12) United States Patent
Kim et al.

(10) Patent No.: US 8,951,834 B1
(45) Date of Patent: Feb. 10, 2015

(54) METHODS OF FORMING SOLDER BALLS IN SEMICONDUCTOR PACKAGES

(71) Applicants: Kyung Moon Kim, Seongnam (KR); Il Kwon Shim, Singapore (SG); HeeJo Chi, Yeoju-gun (KR); HanGil Shin, Seoul (KR)

(72) Inventors: Kyung Moon Kim, Seongnam (KR); Il Kwon Shim, Singapore (SG); HeeJo Chi, Yeoju-gun (KR); HanGil Shin, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/931,295

(22) Filed: Jun. 28, 2013

(51) Int. Cl.
| | |
|---|---|
| H01L 21/00 | (2006.01) |
| G01R 31/26 | (2014.01) |
| H01L 21/66 | (2006.01) |
| H01L 23/02 | (2006.01) |
| H01L 23/34 | (2006.01) |
| H01L 23/48 | (2006.01) |
| H01L 23/52 | (2006.01) |
| H01L 29/40 | (2006.01) |
| H01L 21/56 | (2006.01) |

(52) U.S. Cl.
CPC .................................. *H01L 21/565* (2013.01)
USPC ............. 438/106; 438/15; 257/686; 257/777; 257/723; 257/724

(58) Field of Classification Search
USPC ............. 257/686, 777, 723, 724; 438/15, 106
See application file for complete search history.

(56) References Cited

U.S. PATENT DOCUMENTS

| | | | | |
|---|---|---|---|---|
| 5,950,070 | A * | 9/1999 | Razon et al. .................. | 438/113 |
| 6,372,619 | B1 * | 4/2002 | Huang et al. .................. | 438/597 |
| 6,740,578 | B2 * | 5/2004 | Akram .......................... | 438/614 |
| 6,835,592 | B2 * | 12/2004 | Hall et al. ..................... | 438/106 |
| 7,459,349 | B1 * | 12/2008 | Yoshida et al. ............... | 438/126 |
| 7,830,006 | B2 * | 11/2010 | Kolan et al. .................. | 257/737 |
| 7,863,109 | B2 * | 1/2011 | Chow et al. .................. | 438/126 |
| 7,928,540 | B2 * | 4/2011 | Shim et al. .................. | 257/666 |
| 8,035,235 | B2 | 10/2011 | Jang et al. | |
| 8,058,101 | B2 | 11/2011 | Haba et al. | |
| 8,063,477 | B2 * | 11/2011 | Pagaila et al. ................. | 257/686 |
| 8,106,498 | B2 * | 1/2012 | Shin et al. ..................... | 257/686 |
| 8,138,590 | B2 * | 3/2012 | Chow et al. ................... | 257/680 |
| 8,143,101 | B2 | 3/2012 | Sun et al. | |
| 8,304,296 | B2 * | 11/2012 | Ko et al. ....................... | 438/124 |
| 8,378,477 | B2 | 2/2013 | Do et al. | |
| 8,409,917 | B2 * | 4/2013 | Yoon et al. .................... | 438/106 |
| 8,421,203 | B2 * | 4/2013 | Chi et al. ...................... | 257/687 |
| 8,586,408 | B2 * | 11/2013 | Chen et al. .................... | 438/106 |
| 8,633,100 | B2 * | 1/2014 | Yang et al. .................... | 438/612 |
| 2007/0190690 | A1 | 8/2007 | Chow et al. | |
| 2008/0199979 | A1 * | 8/2008 | Kikuchi et al. ................. | 438/15 |
| 2009/0079052 | A1 | 3/2009 | Youn | |
| 2012/0119360 | A1 | 5/2012 | Kim et al. | |
| 2012/0193783 | A1 | 8/2012 | Hong et al. | |
| 2012/0241980 | A1 * | 9/2012 | Ko et al. ....................... | 257/777 |

* cited by examiner

*Primary Examiner* — Evan Pert
*Assistant Examiner* — Gustavo Ramallo

(57) ABSTRACT

Methods of forming solder balls for semiconductor packages using film-assisted molding include providing a substrate, forming a plurality of solder balls on the substrate where each solder ball has an initial profile, and coupling a substantially planar film to the solder balls. As an encapsulation is deposited over the substrate and around the solder balls, the substantially planar film and the encapsulation, along with the molding process, can cause each solder ball to morph from its initial profile to a final profile, where the final profile is generally different from the initial profile.

19 Claims, 4 Drawing Sheets

US 8,951,834 B1

METHODS OF FORMING SOLDER BALLS IN SEMICONDUCTOR PACKAGES

TECHNICAL FIELD

The present disclosure relates generally to semiconductor packaging, and particularly, to the formation of solder balls for semiconductor packages using film-assisted molding.

BACKGROUND

Electronic products have become an integral part of our daily lives. Packages of components such as semiconductor circuits, transistors, diodes, and other electronic devices have become smaller and thinner with more functions and connections. In packaging components, the need for coupling components together in a reliable manner can influence the manufacturing processes.

In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

SUMMARY

Methods of forming solder balls for semiconductor packages using film-assisted molding include providing a substrate, forming a plurality of solder balls on the substrate where each solder ball has an initial profile, and coupling a substantially planar film to the solder balls. As an encapsulation is deposited over the substrate and around the solder balls, the substantially planar film and/or the encapsulation can cause the solder balls to morph from the initial profile to a final profile, where the final profile is generally different from the initial profile.

In one embodiment, a method of forming interconnect structures or solder balls on semiconductor packages includes: (a) providing a substrate, (b) forming an interconnect structure on the substrate, where the interconnect structure has an initial profile, (c) providing a substantially planar film, (d) coupling the substantially planar film to the interconnect structure, and (e) concomitant to the coupling step (d), depositing an encapsulation over the substrate and around the interconnect structure, where at least one of the encapsulation and the substantially planar film is operable to altering the interconnect structure from the initial profile to a final profile, where the final profile is different from the initial profile.

In one embodiment, the method further includes forming an integrated circuit on the substrate adjacent the interconnect structure concomitant to the forming step (b), where the integrated circuit and the encapsulation are substantially coplanar after the depositing step (e). In another embodiment, the forming step (b) includes forming the interconnect structure on the substrate, where the interconnect structure includes an interconnect height, and the depositing step (e) includes depositing the encapsulation, where the encapsulation includes an encapsulation height less than the interconnect height.

In one embodiment, the providing step (c) includes providing the substantially planar film having a film thickness, where the film thickness is less than the difference between the interconnect height and the encapsulation height. In another embodiment, the method further includes providing a mold chase for supporting the substantially planar film concomitant to the providing step (c), where the mold chase facilitates the coupling of the substantially planar film to the interconnect structure during the coupling step (d).

In one embodiment, the forming step (b) includes forming the interconnect structure having the initial profile, where the initial profile includes at least one of contoured and rounded profile. In another embodiment, the depositing step (e) includes altering the interconnect structure to the final profile, where the final profile includes at least one of contourless and flattened profile. In yet another embodiment, the providing step (c) includes providing the substantially planar film having a film modulus, where the film modulus is less than about 30 GPa.

In one embodiment, another method of forming interconnect structures or solder balls on semiconductor packages includes: (a) providing a substrate, (b) forming an interconnect structure on the substrate, where the interconnect structure includes an interconnect height, (c) providing a substantially planar film having a film thickness, (d) coupling the substantially planar film to the interconnect structure, and (e) concomitant to the coupling step (d), depositing an encapsulation over the substrate and around the interconnect structure, where the encapsulation includes an encapsulation height less than the interconnect height, the film thickness is less than the difference between the interconnect height and the encapsulation height, and at least one of the encapsulation and the substantially planar film is operable to altering the interconnect structure to produce a protrusion, the protrusion having a protrusion height in the range of from about 10% to about 90% of the film thickness.

In one embodiment, the method further includes forming an integrated circuit on the substrate adjacent the interconnect structure concomitant to the forming step (b), where the integrated circuit and the encapsulation are substantially coplanar after the depositing step (e). In another embodiment, the method further includes providing a mold chase for supporting the substantially planar film concomitant to the providing step (c), where the mold chase facilitates the coupling of the substantially planar film to the interconnect structure during the coupling step (d).

In one embodiment, the providing step (c) includes providing the substantially planar film having a film modulus, where the film modulus is less than about 10 GPa. In another embodiment, the forming step (b) includes forming the interconnect structure on the substrate, where the interconnect structure includes at least one of contoured and rounded profile.

In one embodiment, the depositing step (e) includes altering the interconnect structure to produce the protrusion having at least one of contourless and flattened profile. In one embodiment, the altering step (e) includes altering the interconnect structure to produce the protrusion having the protrusion height in the range of from about 40% to about 80% of the film thickness.

In one embodiment, a method of forming interconnect structures or solder balls on semiconductor packages includes: (a) providing a substrate, (b) forming an interconnect structure on the substrate, the interconnect structure having an interconnect height, (c) providing a substantially planar film having a film thickness, (d) coupling the substantially planar film to the interconnect structure, and (e) concomitant to the coupling step (d), depositing an encapsulation over the substrate and around the interconnect structure, where the encapsulation includes an encapsulation height less than the interconnect height, the film thickness is substantially equal to or greater than the difference between the interconnect height and the encapsulation height, and at least one of the encapsulation and the substantially planar film is operable to altering the interconnect structure to produce a protrusion with a protrusion height that is substantially similar to the difference between the interconnect height and the encapsulation height.

In one embodiment, the method further includes forming an integrated circuit on the substrate adjacent the interconnect structure concomitant to the forming step (b), where the integrated circuit and the encapsulation are substantially coplanar after the depositing step (e).

In one embodiment, the method further includes providing a mold chase for supporting the substantially planar film concomitant to the providing step (c), where the mold chase facilitates the coupling of the substantially planar film to the interconnect structure during the coupling step (d). In another embodiment, the forming step (b) includes forming the interconnect structure on the substrate, the interconnect structure having an initial profile, and the depositing step (e) includes altering the interconnect structure to produce the protrusion, the protrusion having a final profile, where the final profile and the initial profile are substantially similar.

In one embodiment, the providing step (c) includes providing the substantially planar film having a film modulus, where the film modulus is less than about 30 GPa.

Other variations, embodiments and features of the present disclosure will become evident from the following detailed description, drawings and claims.

DETAILED DESCRIPTION OF THE DISCLOSURE

It will be appreciated by those of ordinary skill in the art that the embodiments disclosed herein can be embodied in other specific forms without departing from the spirit or essential character thereof. The presently disclosed embodiments are therefore considered in all respects to be illustrative and not restrictive.

Figure 1:
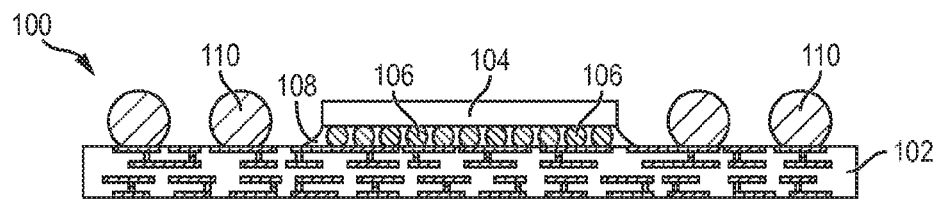
FIG. 1 is a cross-sectional view of a semiconductor package after a plurality of processing steps.

FIG. 1 is a cross-sectional view of a semiconductor package 100 after a plurality of processing steps including without limitation back grinding, dicing saw, chip attach, reflow and flux cleaning, substrate pre-bake, plasma and underfill, curing, and solder bump metallization. These processing steps are known to those skilled in the art and may include commonly known deposition, lithographic, and etching techniques, among others.

In one embodiment, the semiconductor package 100 includes a substrate 102, the substrate 102 having interconnect structures 110 formed thereon. The substrate 102 can be a laminate substrate, a printed circuit board (PCB), a silicon substrate, an organic substrate, a ceramic substrate, a plastic substrate, a package carrier, or some other laminated or flexible structure for redistribution of signals. In some embodiments, the substrate 102 can be a silicon wafer, an interposer, or a redistribution material, among other suitable semiconductor substrates.

Interconnect structures 110 can be formed on the substrate 102 to function as conductive or signal connectors. In some embodiments, the interconnect structures 110 can be solder balls, solder bumps, stud bumps, conductive pillars, or other conductive structures. In other embodiments, the interconnect structures 110 can be solder balls having chemical compositions including without limitation tin, lead, silver, copper and nickel, or combinations thereof.

In addition to the interconnect structures 110, an integrated circuit 104 can be formed on the substrate 102 adjacent the interconnect structures 110. As shown in FIG. 1, the interconnect structures 110 are formed on both sides of the integrated circuit 104 although it will be understood that the interconnect structures 110 can be formed on only one side of the integrated circuit 104 or can be otherwise configured per design specifications. The integrated circuit 104 can be formed on the substrate 102 before or after the formation of the interconnect structures 110. In the alternative, the integrated circuit 104 can be formed concomitant (concurrently or at the same time) as the formation of the interconnect structures 110. The integrated circuit 104 can be a flip chip, a wire-bond chip or other suitable semiconductor device. In some embodiments, other types of integrated circuits 104 including logic, memory, passives, among others, can also be included.

The integrated circuit 104 can be attached to the substrate 102 via internal connectors 106 surrounded by an encapsulation 108 such as a molding compound. The internal connectors 106 may be substantially similar to the interconnect structures 110 including without limitation solder bumps, solder balls, copper pillars, copper balls, among others. The process of forming the encapsulation 108 can be carried out using film-assisted molding, epoxy molding, moldable underfill or other protective molding process. The encapsulation 108 can protect the integrated circuit 104 as well as the internal connectors 106 from moisture, dust and other contaminants.

Alternatively, instead of internal connectors 106 and encapsulation 108, the integrated circuit 104 can be attached to the substrate 102 via an adhesive material (not shown). In another example, the encapsulation 108 may be optional thereby leaving the integrated circuit 104 substantially exposed. The integrated circuit 104 may be encapsulated or protected by a subsequent encapsulation step. This will become more apparent in subsequent figures and discussion.

Figure 2:
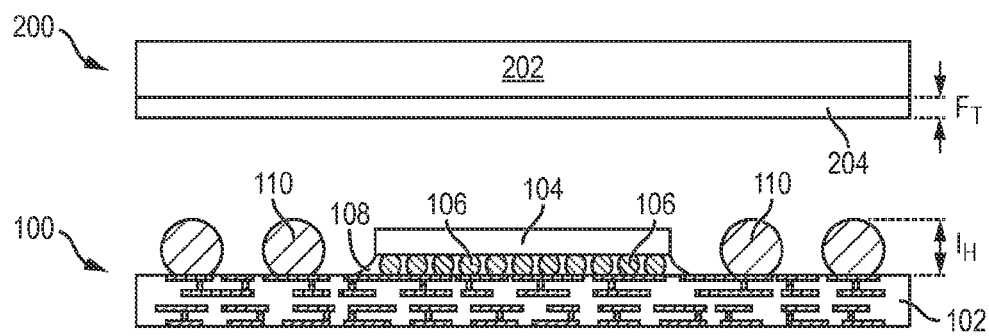
FIG. 2 is a cross-sectional view of FIG. 1 in preparation for film-assisted molding.

FIG. 2 is a cross-sectional view of FIG. 1 in preparation for a film-assisted molding process according to one embodiment of the present disclosure. In this instance, the semiconductor package 100 is in preparation of being coupled to or engaged with a film-assisted molding structure 200. In one embodiment, the film-assisted molding process uses buffer layers (e.g., plastic films) in the mold chase 202 to facilitate the molding process. The film-assisted molding structure 200 can include a film 204 supported by a mold chase 202. Additional details on the film-assisted molding process are disclosed in U.S. Pat. No. 8,035,235 granted Oct. 11, 2011 and filed as U.S. patent application Ser. No. 12/560,312 on Sep. 15, 2009, which is hereby incorporated by reference in its entirety for all purposes.

In one embodiment, the film 204 can have a film modulus depending on the material properties of the film 204. The film modulus may also be referred to as Young's Modulus or elastic modulus. In one embodiment, the film 204 can have a film modulus of from about 18 MPa (megapascal) to about 24 MPa. In some embodiments, the film 204 can have a film modulus of less than about 20 MPa or greater than about 25 MPa. In other embodiments, the film 204 can have a film modulus of less than about 50 GPa (gigapascal), or less than about 30 GPa, or less than about 10 GPa.

In operation, the molding structure 200, including the mold chase 202 and the film 204, may subsequently be secured, engaged or joined to the semiconductor package 100 in forming (e.g., altering, coining, manipulating) the interconnect structures 110. In other words, the molding structure 200 can be mechanically forced or pressed onto the top of the semiconductor package 100. For example, the mold chase 202 and the assist film 204 can be positioned directly on the interconnect structures 110 and the integrated circuit 104 prior to the molding process. Once the molding structure 200 is coupled to the semiconductor package 100, a molding compound or encapsulation 112 can be introduced using known injection molding processes (best illustrated in FIG. 4). The encapsulation 112 can be deposited into cavities and spaces between adjacent interconnect structures 110 and cavities and spaces between the interconnect structures 110 and the integrated circuit 104. If the integrated circuit 104 does not include the encapsulation 108, then the encapsulation 112 may also fill any open spaces underneath the integrated circuit 104.

In one embodiment, each interconnect structure 110 can have an initial interconnect height ($I_H$). For example, the interconnect structures 110 can be solder balls with an interconnect height ($I_H$) of about 250 microns. In some instances, the interconnect height ($I_H$) may also be the diameter of the solder balls 110. In another embodiment, the interconnect structure 110 can also have an initial profile. For example, the initial profile may be rounded. In another example, the initial profile may be contoured. Although shown to be substantially circular or rounded like a solder ball, it will be appreciated by one skilled in the art that the initial profile can take on other polygonal shapes and sizes including oval, elliptical or elongated.

Although disclosed as having a diameter or interconnect height ($I_H$) of about 250 microns, it will be understood by those skilled in the art that any sized interconnect structures 110 may be used including interconnect structures 110 having interconnect height ($I_H$) of about 10 microns, or about 20 microns, or about 30 microns, or about 40 microns, or about 50 microns, or about 75 microns, or about 100 microns, or about 150 microns, or about 200 microns, or greater than about 300 microns. In some examples, the interconnect structures 110 may have interconnect height ($I_H$) of less than about 10 microns.

During the film-assisted molding process, the combination of the substantially planar film 204 and the encapsulation 112 may facilitate in altering the material properties of the interconnect structures 110. In some embodiments, the mold processing conditions including temperature and pressure may also contribute to re-shaping or re-configuring the interconnect structures 110. This will become more apparent in subsequent figures and discussion.

In one embodiment, the mold chase 202 can be substantially planar. In another embodiment, the film 204 may also be substantially planar. The mold chase 202 can be used to support the film 204 as the molding structure 200 engages the semiconductor package 100 during a film-assisted molding process. In some embodiments, the film 204 can be a multi-layered material having a base film and a release layer, where each material can have polymeric or plastic properties. In other embodiments, the assist film 204 can include a thin renewable film that conforms to the underlying structures. For example, the assist film 204 can be a deformable seal film, an adhesive film, or other protective film on the mold chase 202. In one embodiment, the substantially planar film 204 can have a film thickness ($F_T$). The film thickness ($F_T$) can be varied in combination with the mold chase 202 and used in different ways to control the shape of the interconnect structures 110. The film thickness ($F_T$) will also bear relationship to the encapsulation height ($E_H$) and the interconnect height ($I_H$) and will be discussed in more details in subsequent figures and discussion.

Figure 3:
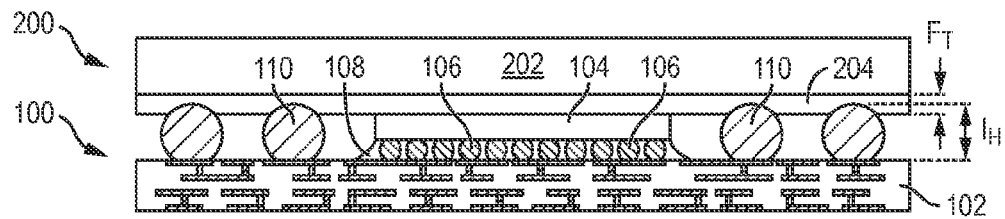
FIG. 3 is a cross-sectional view of FIG. 2 as the film is coupled to the semiconductor package.

FIG. 3 is a cross-sectional view of FIG. 2 of the coupling of the semiconductor package 100 to the molding structure 200, having the film 204 and the mold chase 202. In one embodiment, the film-assisted molding process includes the use of the molding structure 200 according to one embodiment of the present disclosure. The molding structure 200 includes a substantially planar film 204 supported by a mold chase 202, which can facilitate the molding process of depositing the encapsulation 112 between the molding structure 200 and the semiconductor package 100.

In addition to coming into physical contact with the interconnect structures 110, the film 204 also comes in physical contact with the encapsulation 112 as well as the integrated circuit 104. In short, the substantially planar film 204, during the film-assisted molding process, can make physical contact with the top surfaces of all of the structures of the semiconductor package 100. In addition, concomitant or concurrent to the substantially planar film 204, a mold chase 202 can also be used to support the substantially planar film 204, the mold chase 202 capable of facilitating the coupling or engaging process of the substantially planar film 204 to the interconnect structures 110 and for altering the same. In some instances, the use of the assist film 204 during the molding process can help prevent damage to the integrated circuit 104. For example, because the assist film 204 can absorb some of the pressure from the mold chase 202 as it is pressed down on the integrated circuit 104, the incidence of cracks in the inter-layer dielectric of the integrated circuit 104 can be decreased, and reliability of the integrated circuit 104 can be increased.

As shown, the substantially planar film 204 can be coupled to the upper surfaces of the interconnect structures 110. The substantially planar film 204 can be coupled to the interconnect structures 110 by itself or with the assistance of the mold chase 202. The mold chase 202 can facilitate the coupling process by allowing appropriate amounts of pressure and/or temperature to be applied to the semiconductor package 100 during the molding process. Because of the material properties of the film 204, the interconnect structures 110 may be received into portions of the film 204. In other words, because the interconnect structures 110 are generally formed of a harder material than the film 204, the interconnect structures 110 may be driven into and be received within the film 204 as shown by the overlap between the interconnect height ($I_H$) and the film thickness ($F_T$). In addition, the film 204 is also able to make physical contact with the upper surface of the integrated circuit 104.

Figure 4:
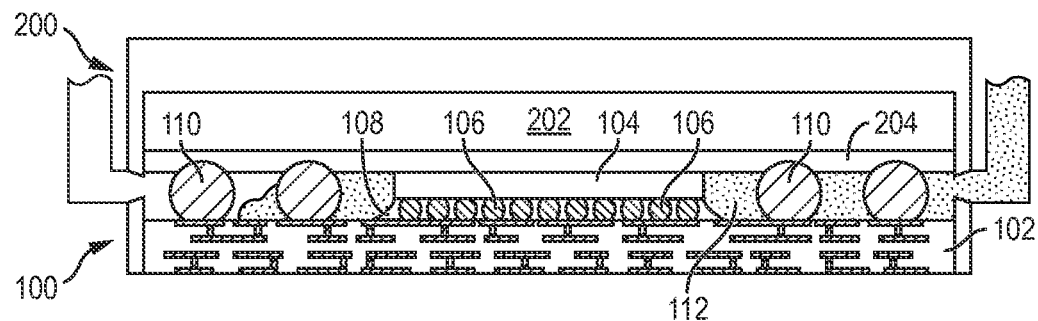
FIG. 4 is a cross-sectional view of FIG. 3 as an encapsulant is being deposited on the semiconductor package.

FIG. 4 is a cross-sectional view of FIG. 3 as an encapsulation 112 is introduced into the semiconductor package 100. In operation, the encapsulation 112 can be deposited over the substrate 102 and around the interconnect structures 110. The encapsulation 112 can be introduced into the semiconductor package 100 through openings or cavities between adjacent interconnect structures 110 as well as those between the integrated circuit 104 and the interconnect structures 110. These cavities are best illustrated in FIG. 3 as the open spaces between the semiconductor package 100 and the molding structure 200. In some embodiments, if the integrated circuit 104 is not already underfilled or encapsulated with encapsulation 108, the subsequent encapsulation 112 may also serve as the underfill or molding compound for the internal interconnects 106 of the integrated circuit 104. In other words, any encapsulation 108 to be accomplished by the earlier step may be integral or integrated (e.g., singular, unitary composition) with the encapsulation 112 resulting in a single encapsulation process. If the integrated circuit 104 is attached to the substrate 102 via an adhesive, then the encapsulation 112 may substantially fill any voids around the integrated circuit 104 and any exposed surfaces not covered by the adhesive.

As illustrated in FIG. 4, the encapsulation 112 can slowly fill the cavities from right to left with some open spaces yet remaining near the left-hand side of the semiconductor package 100. It will be understood that various mold filling encapsulation processes, regardless of filling direction, may be utilized. Furthermore, suitable pressure, temperature and/or time, among other processing conditions and parameters necessary for carrying out the molding process, including reflowing or curing of the encapsulation 112, can be utilized as can be appreciated by one skilled in the art.

In one embodiment, the semiconductor package 100 can be encapsulated with an encapsulation 112, the encapsulation 112 being substantially similar to the encapsulation 108. In other words, the encapsulation 112 can also be carried out using film-assisted molding, epoxy molding, moldable underfill or other protective molding process. In one embodiment, the encapsulation 112 as shown has an overall height less than the interconnect structures 110 so as to allow the profile of the interconnect structures 110 to be manipulated. This will become more apparent in subsequent figures and discussion.

In operation, the encapsulation 112 can be deposited over the substrate 102 and around the interconnect structures 110 as well as the integrated circuit 104. After deposition, the integrated circuit 104 and the encapsulation 112 may be substantially coplanar with the encapsulation 112 having been deposited on the substrate 102 after formation of the interconnect structures 110 and the integrated circuit 104. Substantially coplanar means that although the upper surface of the integrated circuit 104 can be exposed from the encapsulation 112, the upper surface also happens to be on the same plane or axis as the upper surface of the encapsulation 112. In other words, the upper surface of the integrated circuit 104 can be at the same or substantially similar vertical height as the upper surface of the encapsulation 112.

In one embodiment, concomitant or concurrent to the coupling of the planar film 204 to the interconnect structures 110 as shown in FIG. 3, the deposition of the encapsulation 112 as shown in FIG. 4 can be carried out at the same time. In other words, the processing steps in FIGS. 3 and 4 can be concurrently carried out at the same time.

Figure 5:
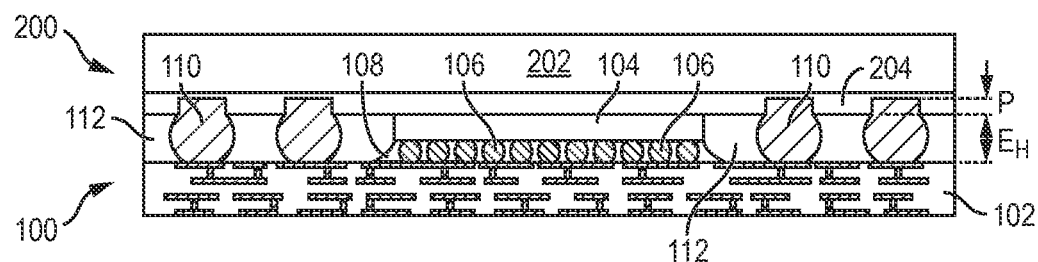
FIG. 5 is a cross-sectional view of FIG. 4 during the film-assisted molding process.

FIG. 5 is a cross-sectional view of FIG. 4 during the film-assisted molding process. As shown, the encapsulation 112 has completely filled the cavities, the encapsulation 112 having an encapsulation height ($E_H$). In one embodiment, the encapsulation 112 can have an encapsulation height ($E_H$) of about 150 microns. In general, the encapsulation height ($E_H$) is less than the interconnect height ($I_H$). However, it is also possible that the encapsulation height ($E_H$) is greater than the interconnect height ($I_H$). In the alternative, the encapsulation height ($E_H$) may also be the same or substantially similar to the interconnect height ($I_H$).

Like above, although disclosed as having an encapsulation height ($E_H$) of about 150 microns, it will be understood by those skilled in the art that the encapsulation 112 can have any thickness. For example, the encapsulation 112 can have an encapsulation height ($E_H$) of about 10 microns, or about 20 microns, or about 30 microns, or about 40 microns, or about 50 microns, or about 75 microns, or about 100 microns, or greater than about 200 microns. In some examples, the encapsulation 112 may have encapsulation height ($E_H$) of less than about 10 microns.

In operation, during the film-assisted molding processes as shown in FIGS. 3-5, the encapsulation 112, along with the substantially planar film 204, are able to alter the interconnect structure 110 from its initial profile to a final profile, where the final profile is different from the initial profile. This altering process can be as a result of the encapsulation 112 or the planar film 204 or both, with assistance from the processing conditions during the molding process including without limitation temperature, pressure and time, among other variables. As shown in FIG. 5, the substantially circular or rounded top of the interconnect structure 110 or solder ball can be altered or manipulated into that of a substantially rigid, rectangular or square-like structure. In some embodiments, the final profile can include at least one of contourless or flattened profile.

In one embodiment, the encapsulation 112 or the film 204 or both are able to alter the interconnect structure 110 to produce a protrusion (P). The protrusion (P) can be measured as the height of the interconnect structure 110 from the top of the encapsulation 112 to the top of the interconnect structure 110. The protrusion can have a protrusion height (P) in the range of from about 10% to about 90% of the film thickness ($F_T$). In some embodiments, the protrusion height (P) can be in the range of from about 40% to about 80% of the film thickness ($F_T$), or in the range of from about 50% to about 75% of the film thickness ($F_T$). In these embodiments, the protrusion height (P) of the interconnect structures 110 can be determined when the film thickness ($F_T$) is less than the difference between the interconnect height ($I_H$) and the encapsulation height ($E_H$), and when the film modulus is less than about 10 GPa.

In some embodiments, the film 204 can have a film thickness ($F_T$) less than the difference between the interconnect height ($I_H$) and the encapsulation height ($E_H$). In other words, the relationship among film thickness ($F_T$), interconnect height ($I_H$), and the encapsulation height ($E_H$) can be determined by the following equation: $[(F_T)<(I_H)-(E_H)]$. For example, with an interconnect height ($I_H$) of about 250 microns, an encapsulation height ($E_H$) of about 150 microns, the film thickness ($F_T$) can be anywhere in the range of from about 1 micron to about 95 microns. In some embodiments, the film thickness ($F_T$) can be in the range of from about 50 microns to about 75 microns, or from about 40 microns to about 60 microns, or from about 60 microns to about 65 microns. In other embodiments, the film 204 can have a film thickness ($F_T$) less than about 95 microns.

In one embodiment, when the encapsulation 112 includes an encapsulation height ($E_H$) less than the interconnect height and where the film thickness ($F_T$) is less than the difference or delta between the interconnect height ($I_H$) and the encapsulation height ($E_H$), the encapsulation 112 and/or the substantially planar film 204 are operable to altering the interconnect structure 110 to produce a protrusion, where the protrusion includes a protrusion height (P) in the range of from about 10% to about 90% of the film thickness ($F_T$).

In another embodiment, the film 204 can have a film thickness ($F_T$) substantially equal to or greater than the difference between the interconnect height ($I_H$) and the encapsulation height ($E_H$). In other words, the relationship among film thickness ($F_T$), interconnect height ($I_H$), and the encapsulation height ($E_H$) can be determined by the following equation: $[(F_T) \geq (I_H) - (E_H)]$. For example, with an interconnect height ($I_H$) of about 250 microns, an encapsulation height ($E_H$) of about 150 microns, the film thickness ($F_T$) can range anywhere from 100 microns to about 150 microns. In some embodiments, the film thickness ($F_T$) can be in the range of from about 100 microns to about 200 microns, or from about 100 microns to about 300 microns, or from about 150 microns or about 200 microns. In other embodiments, the film 204 can have a film thickness ($F_T$) greater than or equal to about 100 microns.

In some embodiments, when the film thickness ($F_T$) is substantially equal to or greater than the difference between the interconnect height ($I_H$) and the encapsulation height ($E_H$), and where the film modulus is less than about 30 GPa, the resulting protrusion height (P) of the interconnect structures 110 can be substantially similar to the difference between the interconnect height ($I_H$) and the encapsulation height ($E_H$). In other words, the protrusion height (P) may be substantially similar to the film thickness ($F_T$) resulting in little to no coining of the solder balls 110. In these instances, the interconnect structures 110 as initially formed may have an initial profile. When the substantially planar film 204 is coupled to the interconnect structures 110 and encapsulation 112 is introduced, the film 204 and the encapsulation 112 are operable to alter the interconnect structures 110 such that the interconnect structures 110 now have a final profile. In this case, the final profile and the initial profile may be substantially similar because the film thickness ($F_T$) is substantially equal to or greater than the difference between the interconnect height ($I_H$) and the encapsulation height ($E_H$), independent of the film modulus.

In one embodiment, when the encapsulation 112 includes an encapsulation height ($E_H$) less than the interconnect height and where the film thickness ($F_T$) is equal to or greater than the difference or delta between the interconnect height ($I_H$) and the encapsulation height ($E_H$), the encapsulation 112 and/or the substantially planar film 204 is operable to altering the interconnect structure 110 to produce a protrusion, where the protrusion includes a protrusion height (P) that is substantially similar to the difference or delta between the interconnect height ($I_H$) and the encapsulation height ($E_H$). In some embodiments, the protrusion height (P) may be substantially similar to the film thickness ($F_T$). In these instances, the interconnect structure 110 may be altered from an initial profile to that of a protrusion with a final profile, where the final profile may be substantially similar to the initial profile.

Figure 6:
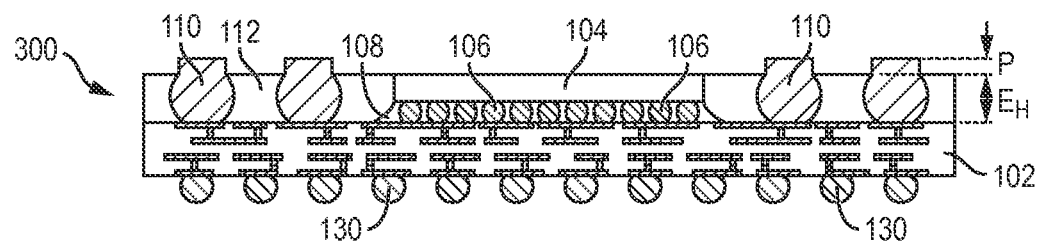
FIG. 6 is a cross-sectional view of the semiconductor package after having completed the film-assisted molding process according to one embodiment of the present disclosure.

FIG. 6 is a cross-sectional view of a semiconductor package 300 after having completed the film-assisted molding process according to one embodiment of the present disclosure. The semiconductor package 300 is substantially similar to the semiconductor package 100 of FIG. 5, with the exception that the molding structure 200 has been removed. After removal of the mold chase 202 and the film 204, the interconnect structures 110 and the integrated circuit 104 can be exposed from the encapsulation 112. In addition, portions of the upper surfaces of the encapsulation 112 may also be exposed.

As shown, upon completion of the film-assisted molding process, the molding structure 200 can be removed leaving the interconnect structures 110 with a contourless or flattened profile as discussed above. The remaining components of the semiconductor package 100 remain substantially unchanged. In some instances, the interconnect structures 110 may also be referred to as having been "coined" during the film-assisted molding process, with the coining process occurring concurrently with the molding process.

In one embodiment, prior to the coupling step and during the initial formation step of forming the interconnect structures 110 on the substrate 102, the interconnect structures 110 can have contoured or rounded profiles. In other words, the solder balls 110 can be substantially spherical. Upon coupling of the substantially planar film 204 to the interconnect structures 110 and applying the appropriate pressure and temperature conditions during the deposition of the encapsulation 112, the material properties of the film 204 along with the encapsulation 112 are able to alter or cause the interconnect structures 110 to morph into a contourless or flattened profile. In this instance, the interconnect structures 110 can have a flattened top as best illustrated in FIGS. 5-6. In other instances, this flattened top may also be referred to as being coined or having to undergo a coining process.

The currently disclosed embodiments are able to cause the interconnect structures 110 to be altered, changed or manipulated from an initial profile to a final profile, where the initial profile may be spherical, circular or contoured, while the final profile may be semi-rectangular, semi-square, semi-flattened or semi-contourless. Furthermore, this may be achieved with a substantially planar film 204 in combination with an optionally substantially planar mold chase 202. In other words, the film 204 and/or mold chase 202 need not be specifically customized (e.g., take on the shape of the desired final profile) in order to alter the interconnect structures 110, e.g., the film 204 and/or mold chase 202 need not have a concaving profile or a cavity-containing profile in order to "coin" the interconnect structures 110 to produce the final profile. Accordingly, the currently disclosed embodiments are able to mold and coin the interconnect structures 110 using a substantially planar film 204 and/or mold chase 202 without the film 204 and/or mold chase 202 having to take on any specific profile including concavity and/or curvature, among other profile-containing cross-sections.

As demonstrated by the above embodiments, by manipulating the film thickness ($F_T$) as well as the film properties (e.g., modulus) and processing conditions (e.g., temperature, pressure), it may be possible to coin and mold a semiconductor package 300 during a film-assisted molding step thereby realizing cost savings and elimination of additional processing steps. Furthermore, this can be achieved with a conventional, standard mold chase 202 and substantially planar film 204 without having to redesign the mold chase 202 (e.g., providing concavity, rigidity or planarity in the mold chase). It will be appreciated by one skilled in the art that additional processes may be utilized for eliminating any mold resin residue on the surfaces of the solder balls 110 including without limitation post-mold reflow, water jet, chemical or laser deflash processes. Likewise, additional laser marking, post cleaning, saw and dice and inspection processes may be performed for preparing the semiconductor package 300 for additional processing including the addition of another semiconductor package 300 stacked thereon (not shown).

One of the benefits realized with the current process is that of the elimination of using a molded laser process to facilitate the manufacturing of integrating additional packages on existing packages. Furthermore, other processing steps including the likes of laser ablation, bake and via cleaning may also be eliminated. The disclosed processes may be implemented with existing film-assisted molding process and tool, and by being able to control the protrusion height (P) of the solder balls 110 from the mold surface by varying the modulus and/or thickness of the film 204 allows for design flexibility. In addition, because the film 204 can be fed into the mold chase 202 by roll-to-roll feeding, molding cleaning may not be necessary thereby allowing for higher throughput as well as cheaper molding cost.

In some embodiments, the interconnect structures 110 can be characterized by the physical characteristics of the assist film 204. For example, the assist film 204 can cause the upper surfaces of the interconnect structures 110 to be smoother than with the use of the mold chase 202 alone due to the assist film 204 flattening out during the molding process. The assist film 204 being used can leave the upper surfaces of the interconnect structures 110 with an unblemished surface finish due to the softness of the assist film 204. The assist film 204 can also leave the upper surfaces of the interconnect structures 110 free of mold flash because the assist film 204 forms a seal against unnecessary bleeding of molding compound. The assist film 204 can also cause the upper surfaces of the interconnect structures 110 to be coined. This will become more apparent in subsequent figures and discussion.

Figure 7:
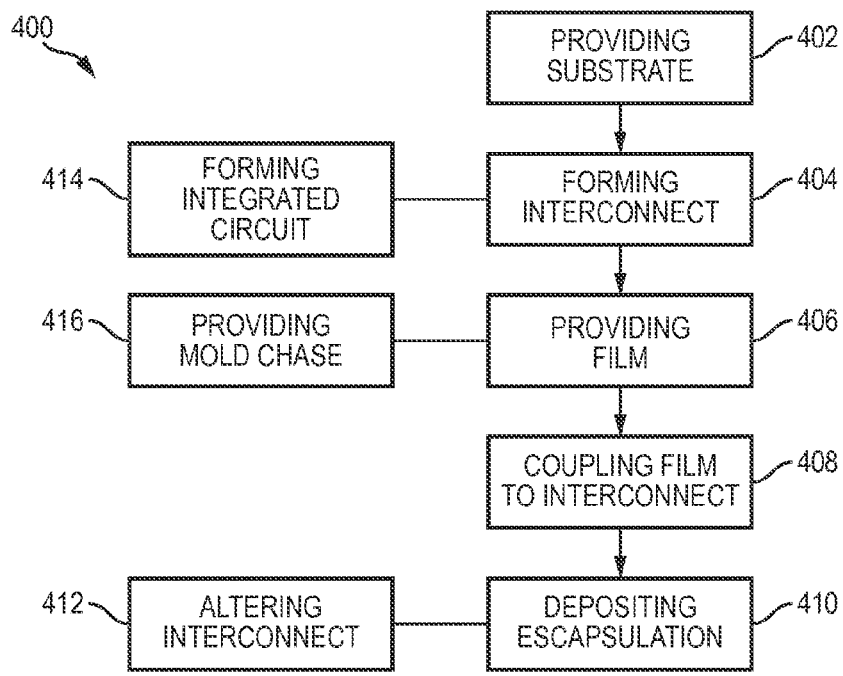
FIG. 7 is a flow diagram showing multiple methods of manufacturing interconnect structures in a semiconductor package using film-assisted molding process according to various embodiments of the present disclosure.

FIG. 7 is a flow diagram showing multiple methods 400 of manufacturing interconnect structures or solder balls in a semiconductor package using film-assisted molding process according to various embodiments of the present disclosure.

In one embodiment, a method of forming interconnect structures (e.g., solder balls) on a semiconductor package includes step (a) of providing a substrate 402 followed by step (b) of forming an interconnect structure 404 on the substrate, where the interconnect structure includes an initial profile. In some embodiments, the initial profile of the interconnect structure can be contoured or rounded. Next, step (c) includes providing a film 406, where the film can be substantially planar followed by step (d) of coupling the film to the interconnect structure 408.

Step (e) includes depositing an encapsulation 410 over the substrate and around the interconnect structure, where step (e) can be carried out in conjunction or concomitant to step (d). During the encapsulation or molding process of step (e), the encapsulation or the substantially planar film or both are operable to altering the interconnect structure 412 from the initial profile to a final profile, where the final profile is different from the initial profile. In some embodiments, the final profile can be contourless or flattened.

In one embodiment, during or concomitant (e.g., concurrent or at the same time) to step (b) of forming of the interconnect structure 404, formation of an integrated circuit 414 can take place on the substrate adjacent the interconnect structure. In some embodiments, the forming of the integrated circuit 414 can take place before or after the forming of the interconnect structure 404. The integrated circuit, after being formed on the substrate and adjacent the interconnect structure, can also be subjected to the encapsulation or molding process where the encapsulation can be formed substantially around the integrated circuit. In other words, an encapsulation can be deposited over the substrate and around the interconnect structure as well as around the integrated circuit. After the encapsulation has been formed around the integrated circuit as described in step (e), the integrated circuit and the encapsulation can be substantially coplanar. In other words, the integrated circuit and the encapsulation can have at least one common plane (e.g., upper most surfaces of the integrated circuit and the encapsulation away from the substrate).

In one embodiment, during step (b) of forming the interconnect structure 404, the interconnect structure can be formed with an interconnect height ($I_H$) while during step (e) of depositing the encapsulation 410, the encapsulation can be formed with an encapsulation height ($E_H$) that is less than the interconnect height ($I_H$). In one embodiment, during step (c) of providing the substantially planar film 406, the substantially planar film can have a film thickness ($F_T$), where the film thickness ($F_T$) is less than the difference between the interconnect height ($I_H$) and the encapsulation height ($E_H$). In another embodiment, the substantially planar film can have a film modulus that is less than about 30 GPa.

In yet another embodiment, during or concomitant (e.g., concurrent or at the same time) to step (c) of providing the substantially planar film 406, a mold chase can be provided 416 to be used as support for the substantially planar film. In other words, step (c) can include the step of providing a mold chase 416 for supporting the substantially planar film concomitant to the providing step (c), where the mold chase facilitates in the coupling of the substantially planar film to the interconnect structure 408 as discussed in the coupling step (d).

In one embodiment, a method of forming interconnect structures (e.g., solder balls) on a semiconductor package includes step (a) of providing a substrate 402 followed by step (b) of forming an interconnect structure 404 on the substrate, where the interconnect structure includes an interconnect height ($I_H$). In some embodiments, the interconnect structure can have contoured or rounded profile. Next, step (c) includes providing a film 406, where the film can be substantially planar with a film thickness ($F_T$) followed by step (d) of coupling the film to the interconnect structure 408. In one embodiment, the substantially planar film can have a film modulus that is less than about 30 GPa. In another embodiment, the substantially planar film can have a film modulus that is less than about 10 GPa.

Step (e) includes depositing an encapsulation 410 over the substrate and around the interconnect structure, where step (e) can be carried out in conjunction or concomitant to step (d). In one embodiment, the deposited encapsulation can have an encapsulation height ($E_H$) less than the interconnect height ($I_H$) while the film thickness ($F_T$) is less than the difference between the interconnect height ($I_H$) and the encapsulation height ($E_H$). During the encapsulation or molding process of step (e), the encapsulation or the substantially planar film or both are operable to altering the interconnect structure 412 to produce a protrusion (P), where the protrusion (P) includes a protrusion height in the range of from about 10% to about 90% of the film thickness ($F_T$). In another embodiment, during the altering of the interconnect structure 412, the protrusion can produce protrusion height in the range of from about 40% to about 80% of the film thickness ($F_T$).

In one embodiment, during or concomitant (e.g., concurrent or at the same time) to step (b) of forming of the interconnect structure 404, formation of an integrated circuit 414 can take place on the substrate adjacent the interconnect structure. In some embodiments, the forming of the integrated circuit 414 can take place before or after the forming of the interconnect structure 404. The integrated circuit, after being formed on the substrate and adjacent the interconnect structure, can also be subjected to the encapsulation or molding process where the encapsulation can be formed substantially around the integrated circuit. In other words, an encapsulation can be deposited over the substrate and around the interconnect structure as well as around the integrated circuit. After the encapsulation has been formed around the integrated circuit as described in step (e), the integrated circuit and the encapsulation can be substantially coplanar. In other words, the integrated circuit and the encapsulation can have at least one common plane (e.g., upper most surfaces of the integrated circuit and the encapsulation away from the substrate).

In yet another embodiment, during or concomitant (e.g., concurrent or at the same time) to step (c) of providing the substantially planar film 406, a mold chase can be provided 416 to be used as support for the substantially planar film. In other words, step (c) can include the step of providing a mold chase 416 for supporting the substantially planar film concomitant to the providing step (c), where the mold chase facilitates in the coupling of the substantially planar film to the interconnect structure 408 as discussed in the coupling step (d).

In one embodiment, a method of forming interconnect structures (e.g., solder balls) on a semiconductor package includes step (a) of providing a substrate 402 followed by step (b) of forming an interconnect structure 404 on the substrate, where the interconnect structure includes an interconnect height ($I_H$). In some embodiments, the interconnect structure can include an initial profile (e.g., contoured or rounded). Next, step (c) includes providing a film 406, where the film can be substantially planar with a film thickness ($F_T$) followed by step (d) of coupling the film to the interconnect structure 408. In one embodiment, the substantially planar film can have a film modulus that is less than about 30 GPa. In another embodiment, the substantially planar film can have a film modulus that is less than about 10 GPa.

Step (e) includes depositing an encapsulation 410 over the substrate and around the interconnect structure, where step (e) can be carried out in conjunction or concomitant to step (d). In one embodiment, the deposited encapsulation can have an encapsulation height ($E_H$) less than the interconnect height ($I_H$) while the film thickness ($F_T$) is substantially equal to or greater than the difference between the interconnect height ($I_H$) and the encapsulation height ($E_H$). During the encapsulation or molding process of step (e), the encapsulation or the substantially planar film or both are operable to altering the interconnect structure 412 to produce a protrusion (P), where the protrusion (P) includes a protrusion height substantially similar to the difference between the interconnect height ($I_H$) and the encapsulation height ($E_H$).

In one embodiment, during or concomitant (e.g., concurrent or at the same time) to step (b) of forming of the interconnect structure 404, formation of an integrated circuit 414 can take place on the substrate adjacent the interconnect structure. In some embodiments, the forming of the integrated circuit 414 can take place before or after the forming of the interconnect structure 404. The integrated circuit, after being formed on the substrate and adjacent the interconnect structure, can also be subjected to the encapsulation or molding process where the encapsulation can be formed substantially around the integrated circuit. In other words, an encapsulation can be deposited over the substrate and around the interconnect structure as well as around the integrated circuit. After the encapsulation has been formed around the integrated circuit as described in step (e), the integrated circuit and the encapsulation can be substantially coplanar. In other words, the integrated circuit and the encapsulation can have at least one common plane (e.g., upper most surfaces of the integrated circuit and the encapsulation away from the substrate).

In yet another embodiment, during or concomitant (e.g., concurrent or at the same time) to step (c) of providing the substantially planar film 406, a mold chase can be provided 416 to be used as support for the substantially planar film. In other words, step (c) can include the step of providing a mold chase 416 for supporting the substantially planar film concomitant to the providing step (c), where the mold chase facilitates in the coupling of the substantially planar film to the interconnect structure 408 as discussed in the coupling step (d).

The table below provides some examples of the resulting solder ball formation in accordance with the presently disclosed embodiments.

| Parameters | Ex. 1 | Ex. 2 | Ex. 3 | Ex. 4 |
|---|---|---|---|---|
| Interconnect Height ($I_H$) (microns) | 250 | 250 | 250 | 250 |
| Interconnect Modulus (GPa) | 30-60 | 30-60 | 30-60 | 48 |
| Encapsulation Height ($E_H$) (microns) | 150 | 150 | 150 | 150 |
| Delta ($I_H$-$E_H$) (microns) | 100 | 100 | 100 | 100 |
| Film Thickness ($F_T$) (microns) | Any | 100-200 | 50-75 | 63 |
| Film Modulus (GPa) | >30 | <30 | <10 | 0.018-0.024 |
| Protrusion (P) (microns) | 0 | 100 | 30-45 | 38 |

In Ex. 1, the interconnect height ($I_H$) is about 250 microns while the encapsulation height ($E_H$) is about 150 microns, which is about 100 microns less than the interconnect height ($I_H$). In other words, the delta or difference between the interconnect height ($I_H$) and the encapsulation height ($E_H$) is about 100 microns. The interconnect structure has a modulus in the range of from about 30 GPa to about 60 GPa although it will be appreciated by one skilled in the art that the interconnect modulus can be greater than or less than this range of values. In this example, the substantially planar film can take on any film thickness ($F_T$) because the film modulus is substantially similar to or in some instances greater than the modulus of the interconnect structure. As such, during the coupling of the substantially planar film to the interconnect structure and the depositing of the encapsulation during the film-assisted molding process, the protrusion of the interconnect structure may be zero or non-existent since the high modulus of the film will flatten any type of protrusion. As such, the resulting interconnect structure may be substantially coplanar to the encapsulation as well as the integrated circuit.

In Ex. 2, the interconnect height ($I_H$) is about 250 microns while the encapsulation height ($E_H$) is about 150 microns, which is about 100 microns less than the interconnect height ($I_H$). In other words, the delta or difference between the interconnect height ($I_H$) and the encapsulation height ($E_H$) is about 100 microns. The interconnect structure has a modulus in the range of from about 30 GPa to about 60 GPa although it will be appreciated by one skilled in the art that the interconnect modulus can be greater than or less than this range of values. In this example, the substantially planar film has a film thickness ($F_T$) of about 100 microns to about 200 microns, which is substantially equal to or greater than the difference (delta) between the interconnect height ($I_H$) and the encapsulation height ($E_H$). The film also has a modulus of less than about 30 GPa or less than the modulus of the interconnect structure. In other words, the film is softer than the interconnect structure.

During the encapsulation or molding process as the substantially planar film comes into physical contact with the interconnect structure and the encapsulation is deposited, the combination of the film and the encapsulation, along with the film-assisted molding process conditions (e.g., pressure, temperature), are able to alter the interconnect structure. The resulting interconnect structure is able to achieve a protrusion where the protrusion has a protrusion height (P) substantially similar to the difference (delta) between the interconnect height ($I_H$) and the encapsulation height ($E_H$). In other words, the protrusion (P) of the interconnect structure in Ex. 2 can be about the same as the delta, and in this case, about 100 microns. In some embodiments, the film thickness ($F_T$) may be greater than about 200 microns or more. In other embodiments, the protrusion (P) may be less than about 100 microns depending on the difference (delta) between the interconnect height ($I_H$) and the encapsulation height ($E_H$). In other words, if the difference is about 50 microns, then the protrusion (P) may be about 50 microns, or less, and so forth.

In Ex. 3, the interconnect height ($I_H$) is about 250 microns while the encapsulation height ($E_H$) is about 150 microns, which is about 100 microns less than the interconnect height ($I_H$). In other words, the delta or difference between the interconnect height ($I_H$) and the encapsulation height ($E_H$) is about 100 microns. The interconnect structure has a modulus in the range of from about 30 GPa to about 60 GPa although it will be appreciated by one skilled in the art that the interconnect modulus can be greater than or less than this range of values. In this example, the substantially planar film has a film thickness ($F_T$) in the range of from about 50 microns to about 75 microns, which is less than the difference (delta) of about 100 microns between the interconnect height ($I_H$) and the encapsulation height ($E_H$). The film also has a modulus of less than about 10 GPa or less than the modulus of the interconnect structure. In other words, the film is softer than the interconnect structure.

During the encapsulation or molding process as the substantially planar film comes into physical contact with the interconnect structure and the encapsulation is deposited, the combination of the film and the encapsulation, along with the film-assisted molding process conditions (e.g., pressure, temperature), are able to alter the interconnect structure. The resulting interconnect structure is able to achieve a protrusion where the protrusion has a protrusion height (P) that is about 10% to about 90% of the film thickness ($F_T$). In Ex. 3, the protrusion (P) is in the range of from about 30 microns to about 45 microns, which is in the range of from about 40% (30 microns divided by 75 microns) to about 90% (45 microns divided by 50 microns) of the film thickness ($F_T$). The protrusion (P) can also be at about 60% (30 microns divided by 50 microns or 45 microns divided by 75 microns) of the film thickness ($F_T$). In some embodiments, the protrusion (P) may be in the range of from about 40% to about 80% of the film thickness ($F_T$). In other embodiments, the film thickness ($F_T$) may be about 100 microns or less, or about 95 microns or less, or about 90 microns or less.

Ex. 4 is substantially similar to that of Ex. 3 with the interconnect height ($I_H$) at about 250 microns, the encapsulation height ($E_H$) at about 150 microns, the delta or difference between the interconnect height ($I_H$) and the encapsulation height ($E_H$) at about 100 microns. The interconnect structure has a modulus of about 48 GPa. In this example, the substantially planar film has a film thickness ($F_T$) of about 63 microns, which is less than the difference (delta) of about 100 microns between the interconnect height ($I_H$) and the encapsulation height ($E_H$). The film also has a modulus in the range of from about 180 MPa to about 240 MPa, which is less than the modulus of the interconnect structure. In other words, the film is softer than the interconnect structure.

During the encapsulation or molding process as the substantially planar film comes into physical contact with the interconnect structure and the encapsulation is deposited, the combination of the film and the encapsulation, along with the film-assisted molding process conditions (e.g., pressure, temperature), are able to alter the interconnect structure. The resulting interconnect structure is able to achieve a protrusion where the protrusion has a protrusion height (P) of about 38 microns, which is about 60% (38 microns divided by 63 microns) of the film thickness ($F_T$).

Figure 8:
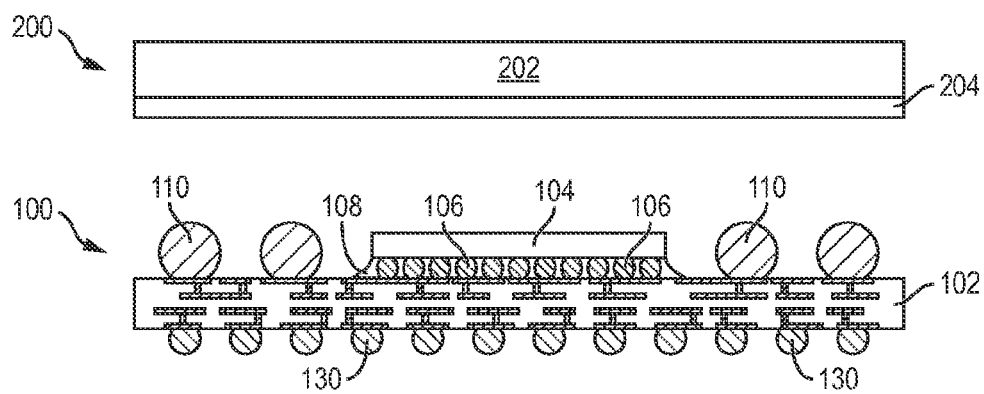
FIGS. 8-9 are cross-sectional views of a semiconductor package before and after film-assisted molding according to one embodiment of the present disclosure.
Figure 9:
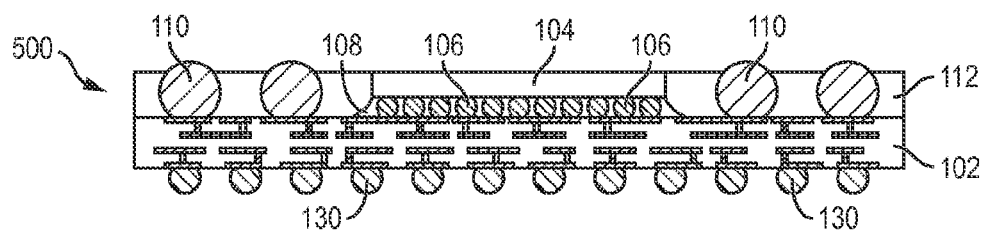

FIGS. 8-9 are cross-sectional views of a semiconductor package before and after film-assisted molding according to one embodiment of the present disclosure. FIG. 8 is substantially similar to that of FIG. 2 while FIG. 9 is substantially similar to that of FIG. 6. The film-assisted molding processes of FIGS. 3-5 are not shown although it will be understood by one skilled in the art that similar processing conditions can be carried out on the package 100 in FIG. 8 to arrive at the package 500 in FIG. 9.

As shown in FIG. 8, the semiconductor package 100 includes a substrate 102 having a plurality of interconnect structures 110 formed thereon along with an integrated circuit 104. The integrated circuit 104 can include inner interconnects 106 protected by an encapsulation 108. The molding structure 200 includes a mold chase 202 along with a substantially planar film 204. In this embodiment, the semiconductor package 100 also includes a plurality of external interconnects 130 on an underside of the substrate 102 opposite the side of the integrated circuit 104 and the interconnect structures 110. The external interconnects 130 may be formed of the same or similar material as those of the internal interconnects 106 for performing substantially similar functions. In this instance, the external interconnects 130 may be used for routing electrical signals to external devices or areas outside of the semiconductor package 100. The external interconnects 130 may also be used for signal routing to other packages (not shown).

FIG. 9 is a cross-sectional view of a semiconductor package 500 that is substantially similar to Ex. 2 discussed above, where the molding structure 200 used includes a conventional mold chase 202 with a film 204 having a film thickness ($F_T$) about 200 microns. With a film thickness ($F_T$) of about 200 microns, which is greater than the difference (delta) of 100 microns between the interconnect height ($I_H$) of 250 microns and the encapsulation height ($E_H$) of 150 microns, the resulting interconnect structure 110 can be altered to produce a protrusion with a protrusion height (P) that is substantially similar to the delta. In this instance, the protrusion (P) did not result in a change of profile in the interconnect structures 110 but instead allowed the interconnect structures 110 to maintain its initial profile. In other words, the interconnect structures 110 started out as being round in shape (FIG. 8) and ended with a rounded shape (FIG. 9) surrounded by encapsulation 112.

Figure 10:
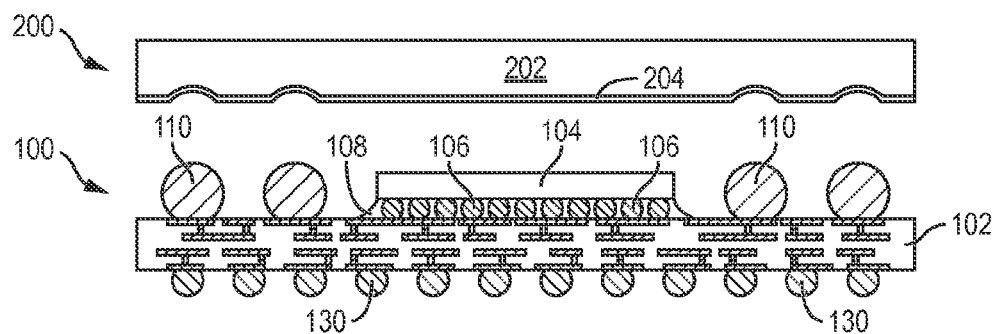
FIGS. 10-11 are cross-sectional views of a semiconductor package before and after film-assisted molding according to one embodiment of the present disclosure.
Figure 11:
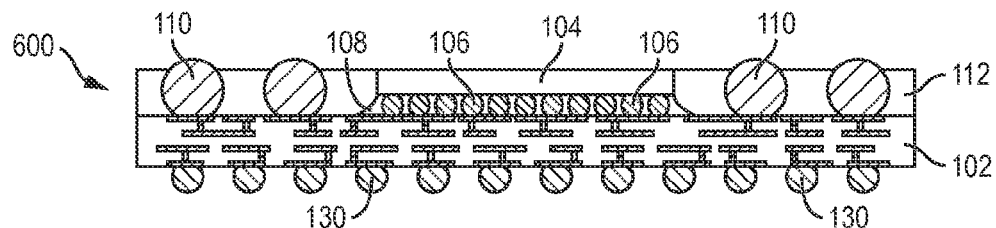

FIGS. 10-11 are cross-sectional views of a semiconductor package before and after film-assisted molding according to another embodiment of the present disclosure. FIG. 10 is substantially similar to that of FIGS. 2 and 8 while FIG. 11 is substantially similar to that of FIGS. 6 and 9. The film-assisted molding processes of FIGS. 3-5 are not shown although it will be understood by one skilled in the art that similar processing conditions can be carried out on the package 100 in FIG. 10 to arrive at the package 600 in FIG. 11.

As shown in FIG. 10, the semiconductor package 100 includes a substrate 102 having a plurality of interconnect structures 110 formed thereon along with an integrated circuit 104, which includes inner interconnects 106 protected by an encapsulation 108. A plurality of external interconnects 130 are formed on the underside of the substrate 102 opposite the interconnect structures 110 and the integrated circuit 104. The molding structure 200 includes a mold chase 202 along with an assist film 204.

FIG. 11 is a cross-sectional view of a semiconductor package 600 that is substantially similar to FIG. 9. However, in this embodiment, the molding structure 200 used includes a mold chase 202 having pre-formed concavity as best illustrated in FIG. 10. In other words, the mold chase 202, along with the film 204, have pre-determined or pre-formed features that complement the profiles of the interconnect structures 110 prior to deposition of encapsulation 112 during film-assisted molding. The resulting structure is one that has a substantially similar profile after encapsulation 112 as shown by the substantially un-altered profile of the interconnect structures 110 in FIG. 11. In this embodiment, the interconnect height ($I_H$) is about 250 microns and the encapsulation height ($E_H$) is about 150 microns to produce a delta of about 100 microns. The film 204 has a film thickness ($F_T$) of about 63 microns, which is less than the delta between the interconnect height ($I_H$) and the encapsulation height ($E_H$). During the encapsulation or molding process as the concaving film 204 comes into physical contact with the interconnect structure 110 and the encapsulation 112 is deposited, the combination of the film 204 and the encapsulation 112, along with the film-assisted molding process conditions (e.g., pressure, temperature), are able to alter the interconnect structure 110. The resulting interconnect structure is able to achieve a protrusion where the protrusion has a protrusion height (P) that is about 10% to about 90% of the film thickness ($F_T$). In this instance, the protrusion height (P) may be about 38 microns. In this embodiment, like that shown in FIGS. 8-9, the protrusion (P) did not result in a change of profile in the interconnect structures 110 but instead allowed the interconnect structures 110 to maintain its initial profile. In other words, the interconnect structures 110 started out as being round in shape (FIG. 10) and maintained its round shape (FIG. 11) surrounded by encapsulation 112, even though there has been a change in the protrusion height (P).

Figure 12:
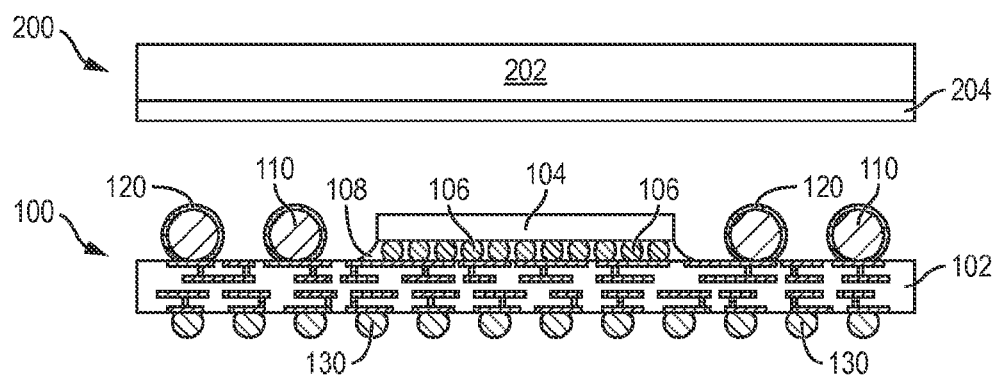
FIGS. 12-13 are cross-sectional views of a semiconductor package before and after film-assisted molding according to one embodiment of the present disclosure.
Figure 13:
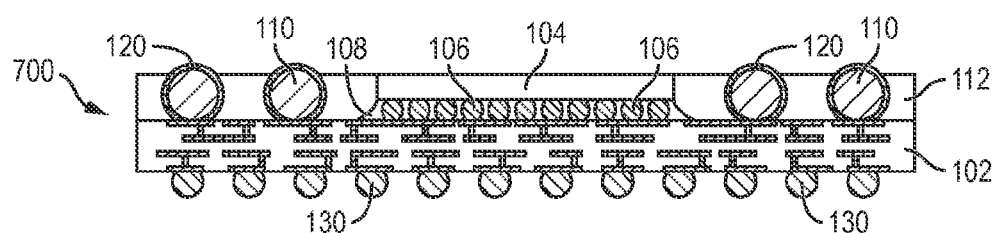

FIGS. 12-13 are cross-sectional views of a semiconductor package before and after film-assisted molding according to yet another embodiment of the present disclosure. FIG. 12 is substantially similar to that of FIGS. 2, 8 and 10 while FIG. 13 is substantially similar to that of FIGS. 6, 9 and 11. The film-assisted molding processes of FIGS. 3-5 are not shown although it will be understood by one skilled in the art that similar processing conditions can be carried out on the package 100 in FIG. 12 to arrive at the package 700 in FIG. 13.

As shown in FIG. 12, the semiconductor package 100 includes a substrate 102 having a plurality of interconnect structures 110 formed thereon along with an integrated circuit 104, which includes inner interconnects 106 protected by an encapsulation 108. A plurality of external interconnects 130 are formed on the underside of the substrate 102 opposite the interconnect structures 110 and the integrated circuit 104. The molding structure 200 includes a mold chase 202 along with an assist film 204. In this instance, the interconnect structures 110 can be surrounded by an outer layer 120. In this embodiment, the interconnect structure 110 may be of a conductive copper or non-conductive polymeric material surrounded by an outer layer 120 of solder material, the overall structure 110, 120 capable of providing better solder jointability, wettability, solderability, among other benefits. In another embodiment, the interconnect structure 110 may be a metal copper material with a diameter of from about 100 to about 300 microns, and the outer layer 120 may include a thin nickel material with a film thickness of from about 1 to about 4 microns, followed by a solder material with a film thickness of from about 10 to about 30 microns.

FIG. 13 is a cross-sectional view of a semiconductor package 700 that is substantially similar to FIG. 9 where the resulting overall structure 110, 120 produced a protrusion with a protrusion height (P) that is substantially similar to the delta. In this instance, the protrusion (P) did not result in a change of profile in the overall structure 110, 120 but instead allowed the overall structure 110, 120 to maintain its initial profile. In other words, the overall structure 110, 120 started out as being round in shape (FIG. 12) and ended with a rounded shape (FIG. 13) surrounded by encapsulation 112. This embodiment demonstrates that the interconnect structure 110 need not be limited to solder balls and that any other solder-able materials may be utilized including without limitation the copper/polymer core solder ball as demonstrated in these figures.

In one embodiment, the interconnect structure 110, 120 including the multi-layer material (e.g., two layers or three layers) may have an initial profile substantially similar to that shown in FIG. 12. After going through a film-assisted molding process according to one embodiment of the present disclosure, the interconnect structure 110, 120 may be altered to a final profile, where the final profile is different from the initial profile. In one instance, the final profile may be coined from that of the initial profile such that the interconnect structure 110, 120 includes a protrusion and the upper surfaces of the interconnect structure 110, 120 may be substantially altered (e.g., rectangular or square). In this instance, because of the multi-layered composition of the interconnect structure 110, 120, the internal layer 110 may be substantially unchanged or unaltered while the external layer or layers 120 may be modified in a substantially similar fashion as discussed above.

In general, by adjusting the modulus and/or thickness of the film, it is possible to produce interconnect structures having protrusions (e.g., flattened, contourless) or without any protrusions (e.g., rounded, contour). In other words, the interconnect structures can be coined or remain uncoined. In some embodiments, by using a film with a high modulus, the interconnect structures may be sufficiently flattened such that the protrusion is zero or negligible. This may be the result of the film modulus exceeding the modulus of the interconnect structures. In addition, by manipulating the modulus and thickness of the film, it may be possible to produce coined interconnect structures with controlled protrusion, as well as uncoined interconnect structures having protrusions that are substantially similar to the film thickness. Furthermore, the presently disclosed embodiments can be achieved using a film-assisted molding process where the molding structure (e.g., mold chase, film) is substantially planar.

Although the current description has been described in detail with reference to several embodiments, additional variations and modifications exist within the scope and spirit of the disclosure.

What is claimed is:

1. A method comprising:
 (a) providing a substrate;

(b) forming an interconnect structure on the substrate, wherein the interconnect structure includes an initial profile and an interconnect height;

(c) providing a substantially planar film;

(d) coupling the substantially planar film to the interconnect structure; and (e) concomitant to the coupling step (d), depositing an encapsulation over the substrate and around the interconnect structure, wherein at least one of the encapsulation and the substantially planar film is operable to altering the interconnect structure from the initial profile to a final profile, wherein the final profile is different from the initial profile and an encapsulation height less than the interconnect height.

2. The method of claim 1, further comprising forming an integrated circuit on the substrate adjacent the interconnect structure concomitant to the forming step (b), wherein the integrated circuit and the encapsulation are substantially coplanar after the depositing step (e).

3. The method of claim 1, wherein:
the providing step (c) includes providing the substantially planar film having a film thickness, wherein the film thickness is less than the difference between the interconnect height and the encapsulation height.

4. The method of claim 1, further comprising providing a mold chase for supporting the substantially planar film concomitant to the providing step (c), wherein the mold chase facilitates the coupling of the substantially planar film to the interconnect structure during the coupling step (d).

5. The method of claim 1, wherein the forming step (b) includes forming the interconnect structure having the initial profile, wherein the initial profile includes at least one of contoured and rounded profile.

6. The method of claim 5, wherein the depositing step (e) includes altering the interconnect structure to the final profile, wherein the final profile includes at least one of contourless and flattened profile.

7. The method of claim 1, wherein the providing step (c) includes providing the substantially planar film having a film modulus, wherein the film modulus is less than about 30 GPa.

8. A method comprising:
(a) providing a substrate;
(b) forming an interconnect structure on the substrate, wherein the interconnect structure includes an interconnect height;
(c) providing a substantially planar film having a film thickness;
(d) coupling the substantially planar film to the interconnect structure; and
(e) concomitant to the coupling step (d), depositing an encapsulation over the substrate and around the interconnect structure,
wherein the encapsulation includes an encapsulation height less than the interconnect height,
wherein the film thickness is less than the difference between the interconnect height and the encapsulation height,
wherein at least one of the encapsulation and the substantially planar film is operable to altering the interconnect structure to produce a protrusion, and
wherein the protrusion includes a protrusion height in the range of from about 10% to about 90% of the film thickness.

9. The method of claim 8, further comprising forming an integrated circuit on the substrate adjacent the interconnect structure concomitant to the forming step (b), wherein the integrated circuit and the encapsulation are substantially coplanar after the depositing step (e).

10. The method of claim 8, further comprising providing a mold chase for supporting the substantially planar film concomitant to the providing step (c), wherein the mold chase facilitates the coupling of the substantially planar film to the interconnect structure during the coupling step (d).

11. The method of claim 8, wherein the providing step (c) includes providing the substantially planar film having a film modulus, wherein the film modulus is less than about 10 GPa.

12. The method of claim 8, wherein the forming step (b) includes forming the interconnect structure on the substrate, wherein the interconnect structure includes at least one of contoured and rounded profile.

13. The method of claim 12, wherein the depositing step (e) includes altering the interconnect structure to produce the protrusion having at least one of contourless and flattened profile.

14. The method of claim 8, wherein the altering step (e) includes altering the interconnect structure to produce the protrusion having the protrusion height in the range of from about 40% to about 80% of the film thickness.

15. A method comprising:
(a) providing a substrate;
(b) forming an interconnect structure on the substrate, wherein the interconnect structure includes an interconnect height;
(c) providing a substantially planar film having a film thickness;
(d) coupling the substantially planar film to the interconnect structure; and
(e) concomitant to the coupling step (d), depositing an encapsulation over the substrate and around the interconnect structure,
wherein the encapsulation includes an encapsulation height less than the interconnect height,
wherein the film thickness is substantially equal to or greater than the difference between the interconnect height and the encapsulation height,
wherein at least one of the encapsulation and the substantially planar film is operable to altering the interconnect structure to produce a protrusion, and
wherein the protrusion includes a protrusion height substantially similar to the difference between the interconnect height and the encapsulation height.

16. The method of claim 15, further comprising forming an integrated circuit on the substrate adjacent the interconnect structure concomitant to the forming step (b), wherein the integrated circuit and the encapsulation are substantially coplanar after the depositing step (e).

17. The method of claim 15, further comprising providing a mold chase for supporting the substantially planar film concomitant to the providing step (c), wherein the mold chase facilitates the coupling of the substantially planar film to the interconnect structure during the coupling step (d).

18. The method of claim 15, wherein:
the forming step (b) includes forming the interconnect structure on the substrate, the interconnect structure having an initial profile; and
the depositing step (e) includes altering the interconnect structure to produce the protrusion, the protrusion having a final profile,
wherein the final profile and the initial profile are substantially similar.

19. The method of claim 15, wherein the providing step (c) includes providing the substantially planar film having a film modulus, wherein the film modulus is less than about 30 GPa.

* * * * *